(12) United States Patent
Scott et al.

(10) Patent No.: US 6,298,429 B1
(45) Date of Patent: Oct. 2, 2001

(54) MEMORY ADDRESS GENERATOR CAPABLE OF ROW-MAJOR AND COLUMN-MAJOR SWEEPS

(75) Inventors: Anne P. Scott, Fort Collins; Jeffery C Brauch, Ft Collins; Jay Fleischman, Fort Collins, all of CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/660,032

(22) Filed: Sep. 12, 2000

Related U.S. Application Data

(63) Continuation of application No. 09/183,172, filed on Oct. 30, 1998, now Pat. No. 6,233,669.

(51) Int. Cl.⁷ .................................................... G06F 12/06
(52) U.S. Cl. .......................... 711/219; 711/217; 711/218; 711/220
(58) Field of Search .................................. 711/217–220; 714/30, 701–702, 720

(56) References Cited

U.S. PATENT DOCUMENTS

| | | | |
|---|---|---|---|
| 4,429,389 | 1/1984 | Catiller | 714/718 |
| 4,771,402 * | 9/1988 | Nakabayashi | 711/217 |
| 5,490,264 | 2/1996 | Wells et al. | 711/154 |
| 5,600,813 | 2/1997 | Nakagawa et al. | 711/217 |
| 5,790,564 | 8/1998 | Adams et al. | 714/738 |
| 5,835,952 * | 11/1998 | Yamauchi et al. | 711/157 |
| 5,960,468 | 9/1999 | Paluch | 711/219 |

* cited by examiner

Primary Examiner—Than Nguyen

(57) ABSTRACT

An improved method and structure for generating addresses of a memory array facilitates the testing of a memory cell by generating the address of any adjacent memory cell to the memory cell under test. The address generation provides for movement to any adjacent memory cell, in any direction, including north, south, east, west, northeast, northwest, southeast, and southwest. The address of any memory cell, even the address of a non-adjacent memory cell, may be selectively generated by defining a current memory address, choosing one or more modes by which increment-generated, decrement-generated, or combination increment/decrement addresses that define a next memory address are generated, and generating the row address and the column address of the next memory address in accordance with interdependent row carry-out and column carry-out operations.

13 Claims, 8 Drawing Sheets

ADDRESS $A_0$ =000000
ADDRESS $A_7$ =000111
ADDRESS $A_8$ =001000
ADDRESS $A_{63}$=111111

ADDRESS REGISTER POINTS TO * IN FIGURE...
TO MOVE EAST, INCREMENT COLUMN LSB
TO MOVE WEST, DECREMENT COLUMN LSB
TO MOVE NORTH, INCREMENT ROW LSB
TO MOVE SOUTH, DECREMENT ROW LSB
TO MOVE NE, INC COLUMN LSB, INC ROW LSB
TO MOVE SE, INC COLUMN LSB, DEC ROW LSB
TO MOVE SW, DEC COLUMN LSB, DEC ROW LSB
TO MOVE NW, DEC COLUMN LSB, INC ROW LSB

MEMORY ADDRESS GENERATOR CAPABLE OF ROW-MAJOR AND COLUMN-MAJOR SWEEPS

CROSS REFERENCE TO RELATED APPLICATION(S)

This is a continuation of application Ser. No. 09/183,172 filed on Oct. 30, 1998 now U.S. Pat. No. 6,233,669.

FIELD OF THE INVENTION

The present invention relates generally to testing memory arrays and, more particularly, to memory address generators used for testing memory arrays.

BACKGROUND OF THE INVENTION

As memory arrays have become faster and smaller, the trend has been to place such high-speed arrays entirely on-chip. Consider, for instance, computer systems. Until quite recently, memory, an integral part of any computer system, has been located on integrated circuit (IC) devices separate from the central processing unit (CPU) of the computer system. Communication between the CPU and separate memory devices was accomplished by porting the inputs and outputs of the memory arrays to package pins of the memory devices to the CPU via address and data busses. As IC fabrication technology has evolved to the sub-micron level, as evidenced by devices fabricated using a 0.25-micron or even smaller fabrication process, it has become possible to place large memory arrays, such as random access memories (RAMs), static random access memories (SRAMs), and cache RAMs, entirely on-chip with other circuitry, such as a CPU. On-chip memory arrays provide the advantage of direct communication with the CPU without the need for I/Os to external pins.

In spite of the advantages provided by placing memory arrays on-chip, there are concerns with how to accomplish testing of such on-chip arrays. On-chip memory arrays, which may account for a large portion, even a majority, of the total die area of a chip, are much harder to control and observe than their discrete predecessors, making it difficult to use traditional external tester equipment and hardware to test, screen, characterize, and monitor on-chip arrays. Visibility into how on-chip memory arrays function is severely limited by the placement of the array-chip interface, such as the interface between a memory array and a CPU core of a microprocessor chip, for instance, on-chip.

Often Built-In-Self-Test (BIST) methodology is used to test on-chip memory arrays. BIST offers the advantage of being on-chip with the memory arrays, thus allowing much greater visibility into memory array functionality than other testing methodologies located external to the chip. Referring to FIG. 1, a BIST implementation 10 is illustrated. BIST moves the test vector generation on-chip microprocessor 20 inside BIST block 24. Multiplexer 28, BIST block 24 and associated address and data bus 34 represent special BIST hardware in the memory datapath. Previous BIST solutions predominantly hard-wired the test vector generation within BIST block 24 to render only limited, fixed test functionality. In order to provide independent access to just the memory array(s) 22, as opposed to accessing the entire chip 20, BIST operation and extraction of test results are typically accomplished through IEEE Standard 1149.1 Joint Test Action Group (JTAG) boundary scan Test Access Port (TAP).

Sequencing through addresses is a fundamental part of testing most memory arrays. In order to properly test integrated circuit memory array devices, it is therefore necessary to generate addresses of the memory array to be tested. Memory arrays are arranged by rows and columns as shown in FIG. 2. An address into a memory array is divided into bits that access the columns of the array and bits that access the rows of an array. The address of each memory cell within the memory array is therefore determined by bits that access the column in which the memory cell is located and bits that access the row in which the memory cell is located.

A memory array composed of eight rows and eight columns, for a total of 64 memory cells, is shown in FIG. 2. Some examples of the address associated with various cells are shown in the figure. The Address A0 of the first cell is 000 000, with the least significant bits identifying the column of the cell and the most significant bits identifying the row of the cell. This particular ordering of the bits of the address is arbitrary and just for purposes of this example; it is understood that any desired ordering of the row and column bits of an address may be implemented. The Address A7 of cell 8 is 000 111. The Address A8, in the next row up and in the same column as the first cell, is 001 000; the column carry-out when moving from address A7 to address A8 is demonstrated in the incrementation of one of the row bits of the address.

Counters are commonly used to generate the addresses of the memory cells that are required for memory array testing and in BIST environments are characteristically the dominant means for generating these required addresses. Traditional counters, however, only increment or decrement in one fixed pattern, i.e. 0, 1, 2, 3, . . . or 10, 9, 8, 7, . . . , and in this lock-step approach, are useful for ensuring that every memory cell of the memory array is eventually accessed.

An important problem with this approach is that at-speed proximity testing of cells of the memory array is not possible. The long set-up procedures that are required before each access of the memory does not allow for at-speed testing of targeted memory cells. Additionally, eventual access of every cell is an oversimplified approach to testing large memory arrays that does not satisfactorily provide the means for effectively testing different kinds of memory cell defects in a targeted manner. For instance, the defects of a particular memory cell of the memory array, whether caused by manufacturing, electrical, or other problems, can be brought out by the transitions that occur in near-by or adjacent memory cells. Simply stepping through the memory may not detect the defect. A better approach is to access potential defective cells or cells of interest, and their neighboring cells. Current counter methods for generating addresses are not capable of such flexibility, however.

As an example, consider the defective memory array "x" shown in FIG. 3. "x" is surrounded by eight adjacent cells 1, 2, 3, 4, 5, 6, 7, and 8. For purposes of clarity, directions corresponding to north, south, east, and west are illustrated in FIG. 3. A traditional counter is only capable of generating addresses that correspond to either an upward or a downward movement. If the counter counted from a south (S) to a north (N) direction, for instance, it would first generate addresses corresponding to cell locations 6, 7, 8 so that these cells could be set by writing to them and then generate addresses corresponding to cell locations 1, 2, 3 so that these cells could be set. After memory cells 6, 7, 8 and then 1, 2, 3 have thus been changed, the "x" cell of interest would then be read to determine if its value has changed. If the "x" cell has changed, this indicates that "x" is defective.

Moving from S to N in this manner is not a complete test, however, for at least two reasons. First, this test did not set adjacent memory cells 4 and 5. The S to N movement only writes the rows around "x" and not the row that actually contains "x". Second, moving in a south to north direction ignores the three other possible directions of movement: north to south, east to west, and west to east. Memory cell "x" may be sensitive to the order in which the adjacent memory cells are written with respect to each other and writing the adjacent memory cells in only the S to N direction does not test this sensitivity. Even a counter that is capable of both incrementing and decrementing, corresponding to the S to N and N to S directions, for example, will only cover two of the four possible directions. Therefore, in order to have a complete and meaningful test of memory cell "x", it is necessary to approach "x" from all directions. No prior art counter is able to generate addresses that will provide memory cell testing from all four directions. What is lacking in the prior art, therefore, is the ability to generate addresses of the cells of a memory array in a manner that provides for complete and flexible testing of any desired cell or cells of the memory array.

SUMMARY OF THE INVENTION

It is therefore an object of the present invention to be able to selectively test memory cells of a memory array in a flexible and thorough manner that provides for comprehensive and focused testing.

It is further an object of the present invention to be able to selectively generate addresses of memory cells of the memory array in such a manner that supports comprehensive and focused testing of the memory array.

Therefore, according to the present invention, a memory address generator structure and methodology satisfies these objectives by utilizing incrementers and decrementers having counters that are capable of generating adjacent memory array addresses in multiple directions. First and third embodiments of the invention are capable of generating adjacent addresses in the north, south, east, and west directions as well as generating addresses in the diagonal direction, such as northeast, northwest, southeast and southwest, for address generation in a total of eight possible directions. Rows and columns of a current address are incremented and decremented simultaneously to produce the diagonal addressing. Either the increment-generated address or the decrement-generated address is used as the generated address of the memory address generator. A second embodiment of the invention generates adjacent addresses in one of four directions, north, south, east, or west, by selectively incrementing and decrementing either the row bits or the column bits of a current address to produce both an increment-generated address and a decrement-generated address; either the increment-generated address or the decrement-generated address is chosen as the generated address of the memory address generator.

Movement to non-adjacent memory cells is accomplished by using the incrementers/decrementers to increment/decrement a current address multiple times or by using an initialization feature of the present invention to generate the non-adjacent address. The current address is initialized to a predetermined or programmable value upon power-up of the memory address generator or upon asserting an initialization signal of the memory address generator.

BRIEF DESCRIPTION OF THE DRAWINGS

The novel features believed characteristic of the invention are set forth in the claims. The invention itself, however, as well as the preferred mode of use, and further objects and advantages thereof, will best be understood by reference to the following detailed description of an illustrative embodiment when read in conjunction with the accompanying drawing(s), wherein:

DESCRIPTION OF THE INVENTION

As previously described, an address into a memory array is divided into bits that access the columns of the array and bits that access the rows of the array; the address is therefore made up of C column bits and R row bits that define the address of a particular memory cell of the memory array. The number of columns and rows of the array are thus represented by $2^C$ and $2^R$, respectively. To count through the columns of the array, referred to as column-major addressing, the column bits are incremented until there is a carry-out of the most significant column bit. The row is then incremented by one and the column bits continue to count.

As an example, consider a 12-bit address in which the two most significant bits (msb) are column bits and the ten least significant bits (lsb) are row bits. Incrementing in column-major order would yield the following address progression:

00 0000000000
01 0000000000
10 0000000000
11 0000000000
00 0000000001
01 0000000001

10 0000000001
11 0000000001
00 0000000010
01 0000000010
10 0000000010
11 0000000010
00 0000000100

By extension, counting through the rows, referred to as row-major addressing, increments the row bits until a carry out is generated from the most significant row bit and the column bits are then incremented by one. Incrementing in a row-major address order would look as follows:

00 1111111100
00 1111111101
00 1111111110
01 0000000000
01 0000000001
01 0000000010
01 0000000011

Additionally, the column bits may be decremented with a row increment on overflow; the column bits may be incremetned with a row decrement on overflow; the row bits may be decremented with a column increment on overflow; and the row bits may be incremented with a column decrement on overflow. Clearly, the concepts of row-major and column-major addressing are valid regardless of the number of column bits and the number of row bits of the memory array. It is again noted that this particular ordering of address bits is arbitrary and is shown as a example only. Any desired ordering of the bits may be implemented.

Figure 1:
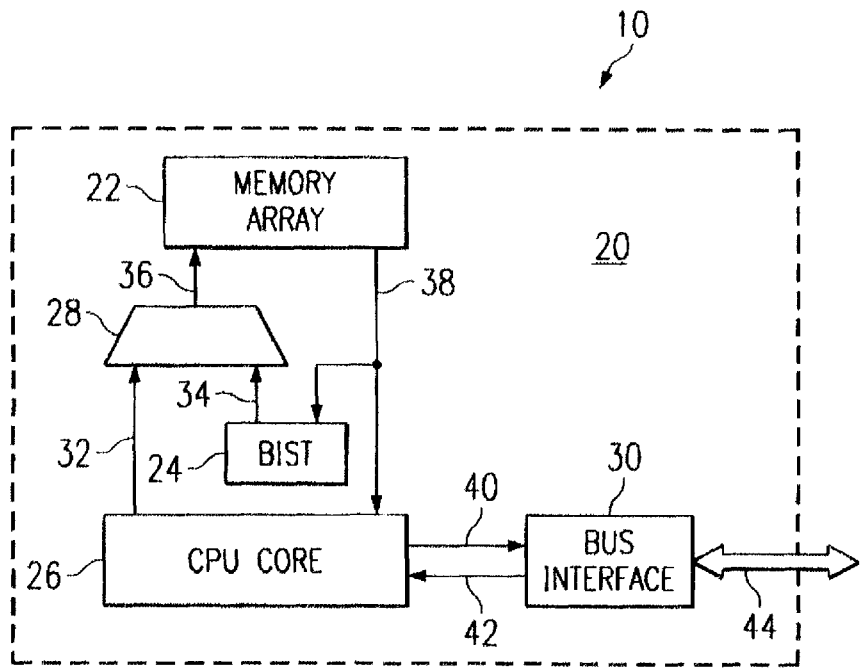
FIG. 1 illustrates a built-in-self-test (BIST) block diagram.
Figure 2:
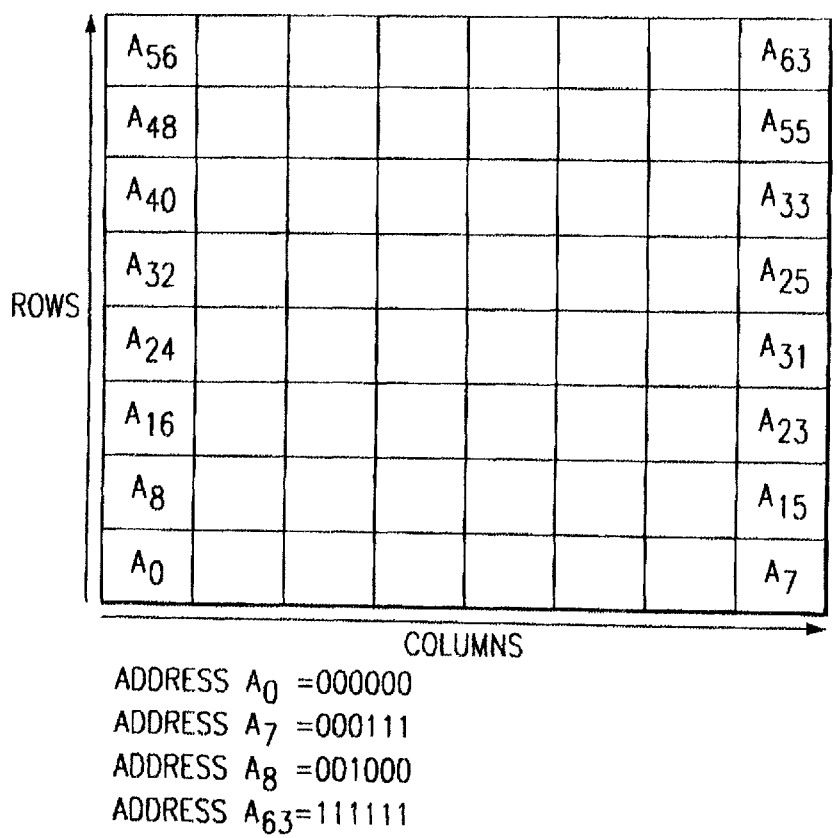
FIG. 2 illustrates a memory array comprised of rows and columns.
Figure 3:
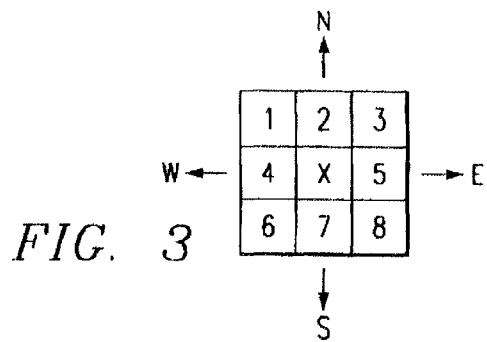
FIG. 3 illustrates a defective memory cell or a cell of interest, "x," and adjacent memory cells of a memory array.

Incrementing the addresses of a memory array in either column-major or row-major fashion generates the address in only two of the four desired directions-a south (S) to north (N) progression and a west (W) to east (E) progression. Thus, referring back to the example demonstrated in FIG. 3, incrementing using row-major addressing provides for the cells of the first column, 1, 4, and 6, to first be written in the S to N direction, then the cells of the second column, 2, X, and 7, to be written in the S to N direction, and finally for the cells of the third column, 3, 5, and 8 to be written in the S to N direction. Row-major addressing incremenation, then, provides that the memory cells will be written in a S to N direction by column in the following chronological order: 6, 4, 1, 7, X, 2, 8, 5, and 3, with memory cell 6 being written first and memory cell 3 being written last. Incrementing using column-major addressing provides for the cells of the first row, 6, 7, and 8, to first be written in the W to E direction, then the cells of the second row, 4, X, and 5, to be written in the W to E direction, and finally for the cells of the third row, 1, 2, and 3, to be written in the W to E direction. Column-major addressing incrementation provides that the memory cells will be written in a W to E direction by row in the following chronological order: 6, 7, 8, 4, X, 5, 1, 2, and 3, with memory cell 6 being written first and memory cell 3 being written last.

While incrementing using column-major addressing or row-major addressing provides for the memory cells adjacent to cell "x" to be written in a S to N direction and a W to E direction, respectively, it does not provides addressing in the N to S and E to W directions. This is provided by decrementing in column-major and row-major order. Decrementing in column-major and row-major order generates addresses of the cells in the opposite order as the incrementation procedure. Incrementing and decrementing in either column-major or row-major order thereby provides the means by which comprehensive testing of a memory cell or cells may be achieved. The embodiments of the present invention provide for selective column-major and row-major address generation.

In addition to being able to selectively generate memory array addresses in any one of four directions, either by row or by column, a second preferred embodiment of the present invention additionally provides for the generation of addresses that are diagonal with respect to the previous address generated. Thus, the first and third embodiments of the present is capable of not only incrementing/decrementing in either a column-major and a row-major manner but also simultaneously incrementing/decrementing by both columns and rows, thereby allowing for the generation of addresses in a diagonal progression.

Figure 4:
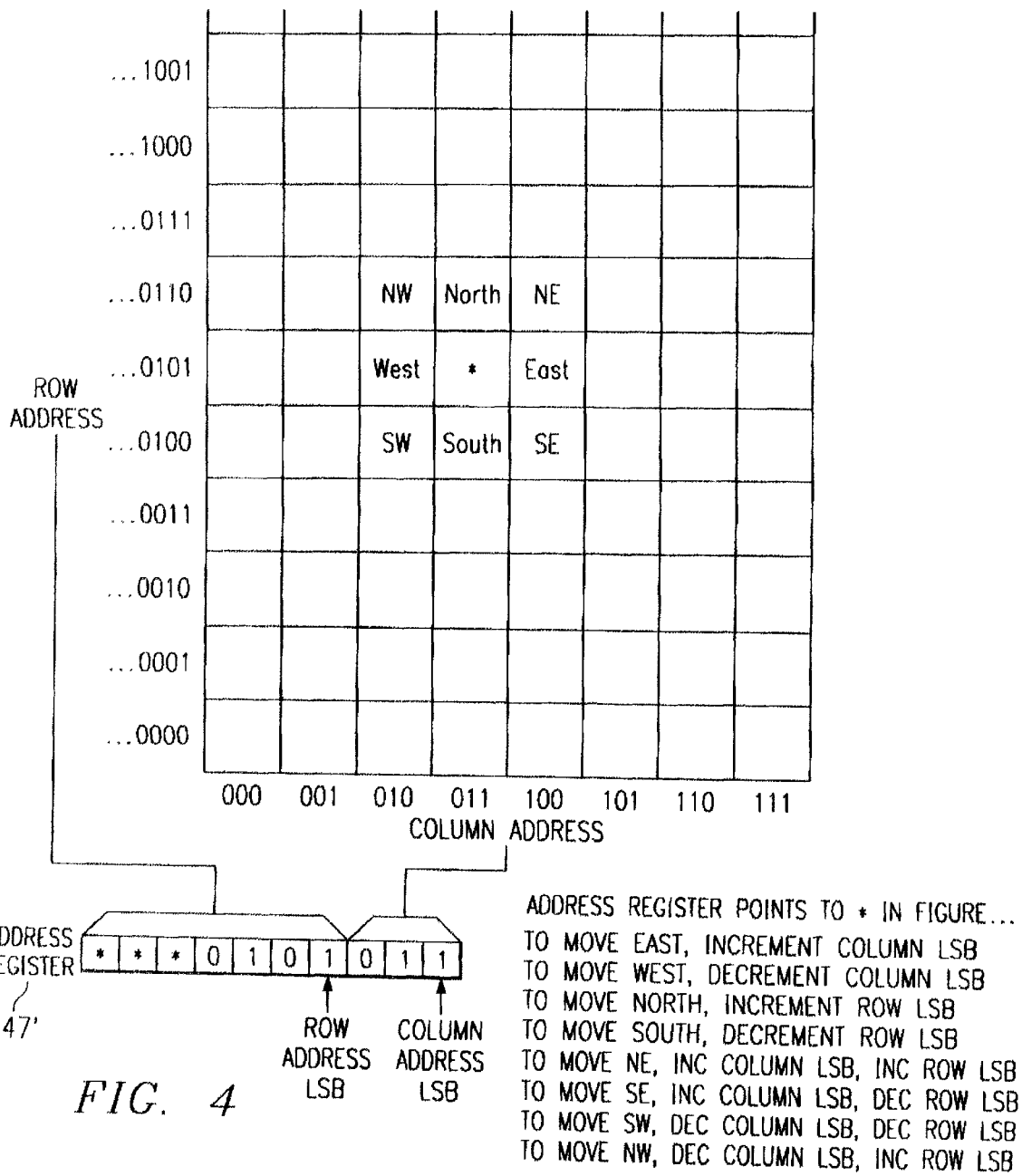
FIG. 4 is a memory array that illustrates row-and-column addressing, including diagonal addressing, according to the present invention.

Referring to FIG. 4, a sample memory array and register illustrate the diagonal row/column addressing capabilities of the first and third embodiments of the present invention. In the memory array shown, the current memory cell is designated by "*" and the memory address generator of the invention will next generate the address of a memory cell that is adjacent to the * cell, unless the memory address generator is initialized. The next memory address that is generated will move from the * memory cell in one of eight directions: either North, South, West, East, Northwest (NW), Northeast (NE), Southeast (SE), or Southwest (SW). To move North, the lsb (least significant bit) of the row bits of the current address (bus 150) is incremented. To move South, the lsb of the row bits of the current address is decremented. To move East, the lsb of the column bits of the current address is incremented and to move West, the lsb of the column bits of the current address is decremented. It is noted that in this example, the msbs of the address are the row bits and the lsbs are the address bits, demonstrating again that the ordering of the address is arbitrary. Movement in a diagonal direction, i.e. NW, NE, SE, and SW, requires simultaneous decrementation/incrementation of both the rows and columns of the current address "*." To move in a NE direction, the lsb's of both the column bits and row bits of the current address are simultaneously incremented. To move in a SE direction, the lsb of the column bits is incremented and the lsb of the row bits is decremented. To move in a SW direction, the lsb's of both the column bits and row bits of the current address are simultaneously decremented. Finally, to move in a NW direction, the lsb of the column bits are decremented and the lsb of the row bits are incremented. The address register 147' is capable of storing a memory address and is therefore an example of storage device 147 of FIG. 11. The NW, NE, SE, and SW directions are not possible using the second embodiment and so the first and third embodiments represent a more flexible approach for generating memory addresses.

The methodology of the present invention may be implemented according to first, second and third preferred embodiments illustrated in FIGS. 5 through 16. In each of the embodiments, a memory address generator has an increment/decrement circuit and a storage and initialization block. The increment/decrement circuitry generates a new address that can be used in testing one or more memory arrays, given certain row and/or column control signals and increment/decrement control signals. The storage and initialization block receives the generated address and stores it temporarily while providing a current address to the increment/decrement circuitry. The first and third embodiments of the invention are capable of counting by rows, by columns, and by rows and columns while the second embodiment counts only by rows or by columns. It is hereby noted that the use of an "incrementer/decrementer" is not to be construed as being limited to a single incrementer or single decrementer; other types of decrementers, such as double incrementer/decrementers, as specifically envisioned as well.

Figure 5:
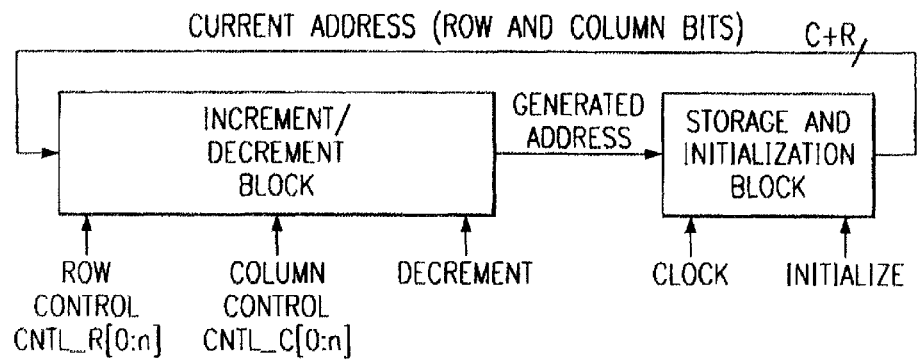
FIG. 5 illustrates block diagram of a memory address generator, according to a first embodiment of the invention.
Figure 6:
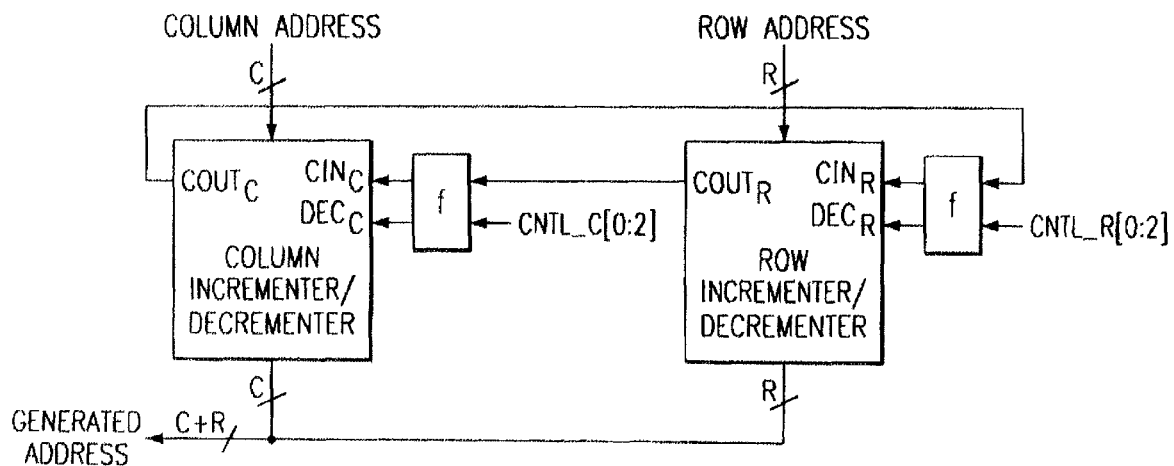
FIG. 6 illustrates an increment/decrement block, according to the first embodiment of the present invention.
Figure 7:
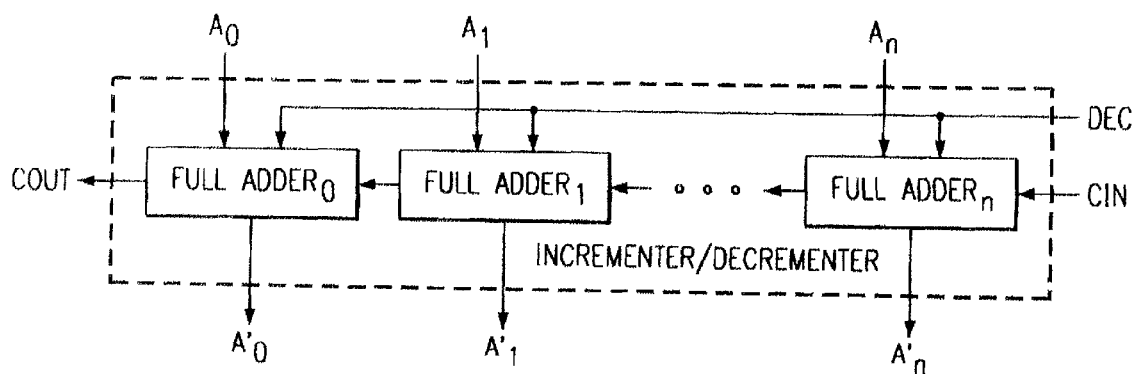
FIG. 7 illustrates an incrementer/decrementer, according to the present invention.
Figure 8:
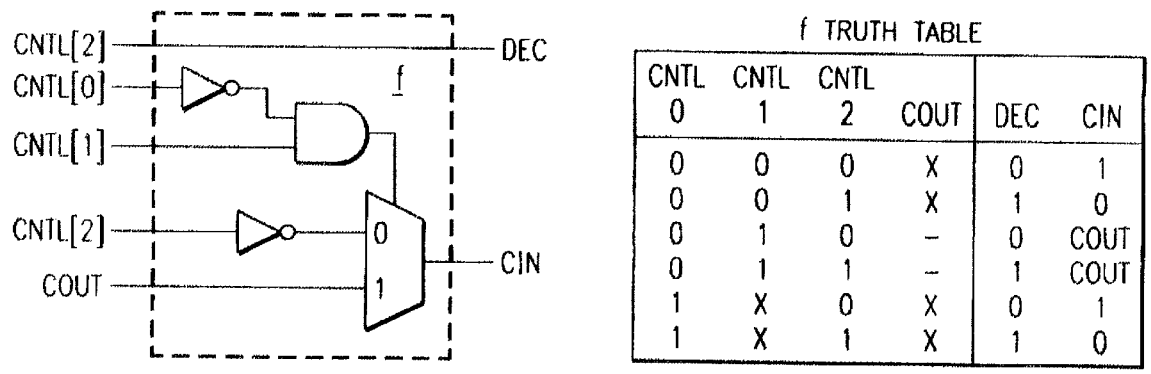
FIG. 8 provides a representative example of the function blocks of FIG. 6 with an accompanying truth table, according to the present invention.

Referring first to FIGS. 5–8, the first embodiment of the present invention, capable of performing column-major addressing, row-major addressing, and diagonal addressing, is illustrated. In FIG. 5, it can be seen that an increment/decrement block containing increment/decrement circuitry is provided with one or more row control signals, one or more column control signals, a decrement/increment control signal, and a current address containing row and column bits to create the generated address. This generated address is received by the storage and initialization block which also receives a clock signal and an initialization control signal, as shown, to generate the current address. The details of the increment/decrement block are shown in FIGS. 6–8; the specifics of the storage and initialization block are discussed in conjunction with FIGS. 10 and 11.

Referring now to FIG. 6, the increment/decrement block of FIG. 5 has a column incrementer/decrementer, a row incrementer/decrementer, a column function block coupled to the column incrementer/decrementer as shown, and a row function block coupled to the row incrementer/decrementer. The row and column function blocks are provided with the appropriate input and control signals. The row function block is provided with the column carry-out signal, coutc, produced by the column incrementer/decrementer, and a number of row control signals, cntl_R[0:2]. The row function block generates a row carry-in signal, cinr, and a row decrement/increment control signal, decr, in accordance with the column carry-out signal and the row control signals. The row incrementer/decrementer receives the output signals of the row function block and the row address of the current address (provided by the storage and initialization block of FIG. 5) to generate the row address of the generated address and a row carry-out signal, coutr.

The column function block and the column incrementer/decrementer operate in a similar fashion. The column function block receives column control signals, cntl_C[0:2], and the row carry-out signal from the row incrementer/decrementer. In accordance with its function, the column function block produces a column carry-in signal, cinc, and a column decrement/increment control signal, decc, that are provided to the column incrementer/decrementer as shown. The column incrementer/decrementer produces the column address of the generated address and the column carry-out signal, coutc. It is noted that while three row control signals and three column control signals are shown in FIG. 6, the number of row and column control signals is not fixed and may be any number that is appropriate.

Figure 10:
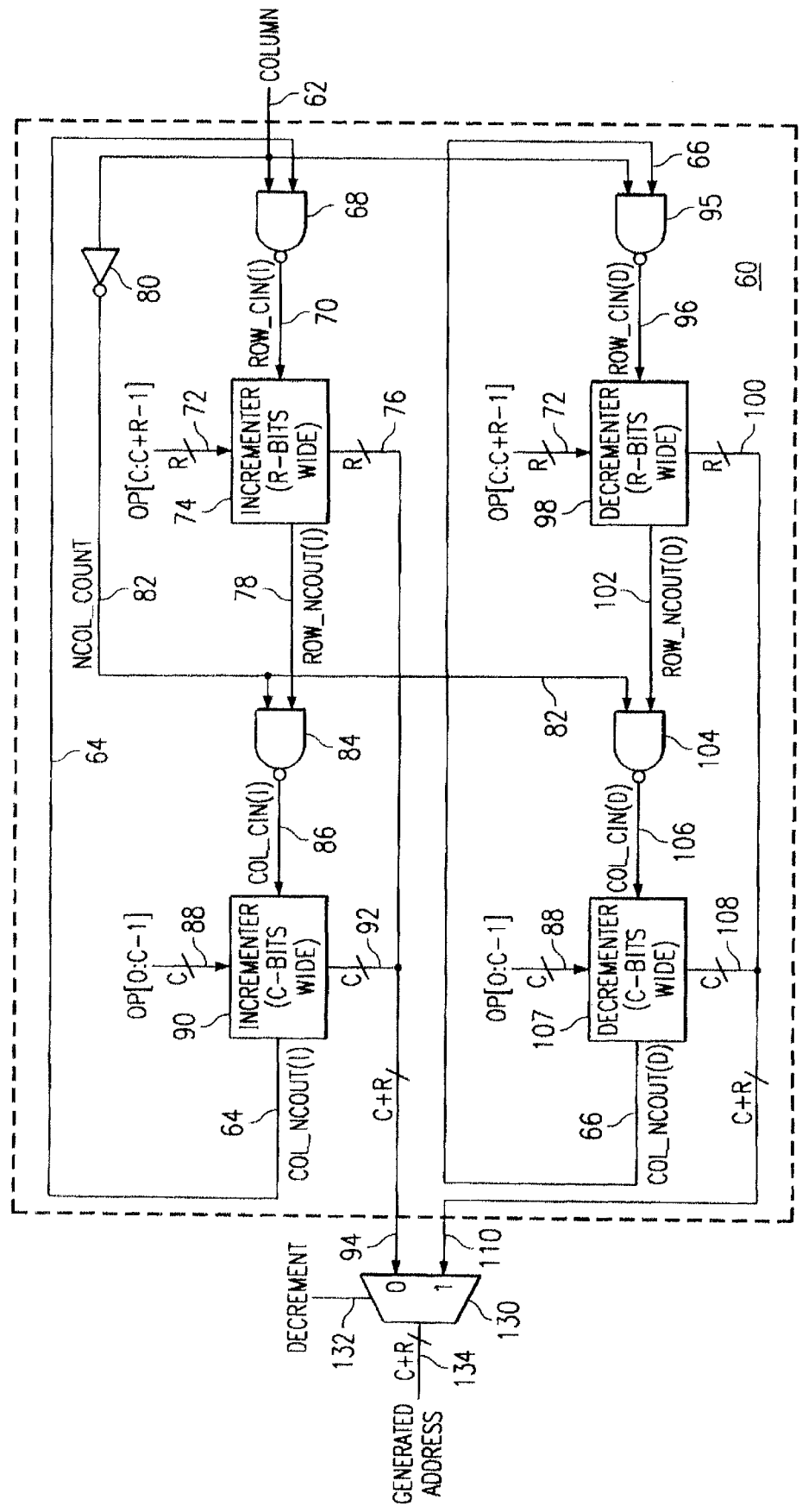
FIG. 10 illustrates an increment/decrement block, according to the second embodiment of the present invention.
Figure 14:
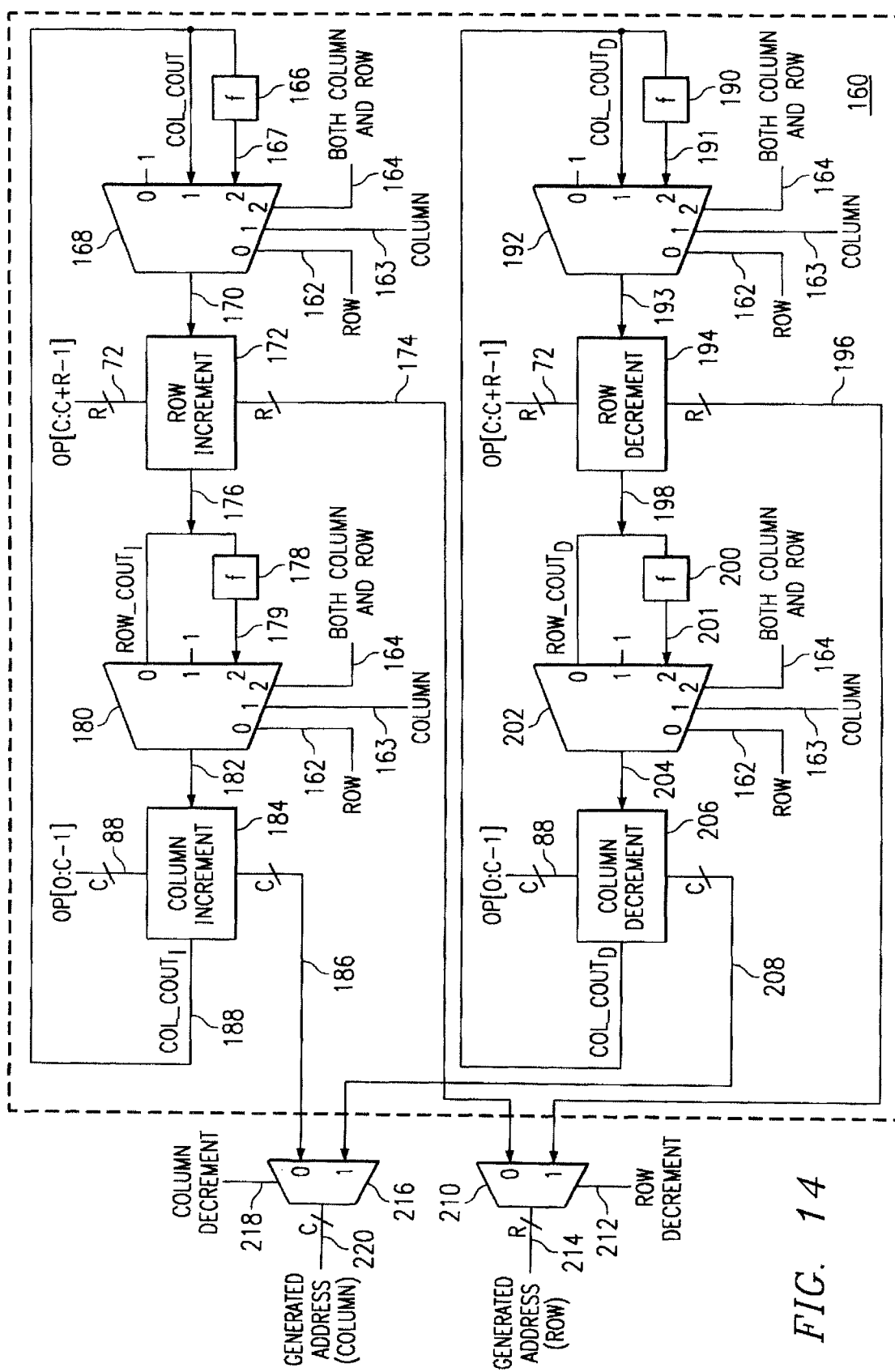
FIG. 14 illustrates increment/decrement block functionality, according to a third preferred embodiment of the present invention.

FIG. 7 illustrates how an incrementer/decrementer may be configured and is applicable to any of the incrementers/decrementers of FIGS. 6, 10, and 14 with any necessary modifications. Other incrementer/decrementer configurations can be used. The incrementer/decrementer has a number of full adders 0 . . . n. Each full adder is provided with the appropriate address bit A0 . . . An and a carry-in signal, cin, from the preceding full adder, with the exception of the initial full adder, full addern, which receives its carry-in signal from the preceding function block. Each adder also receives a decrement/increment signal, dec, that controls it to either increment or decrement the address bit it generates.

FIG. 8 provides an illustrative example of the function blocks of FIG. 6 with an accompanying truth table. The logical function of a function block may be any mode that the user wishes.

Figure 9:
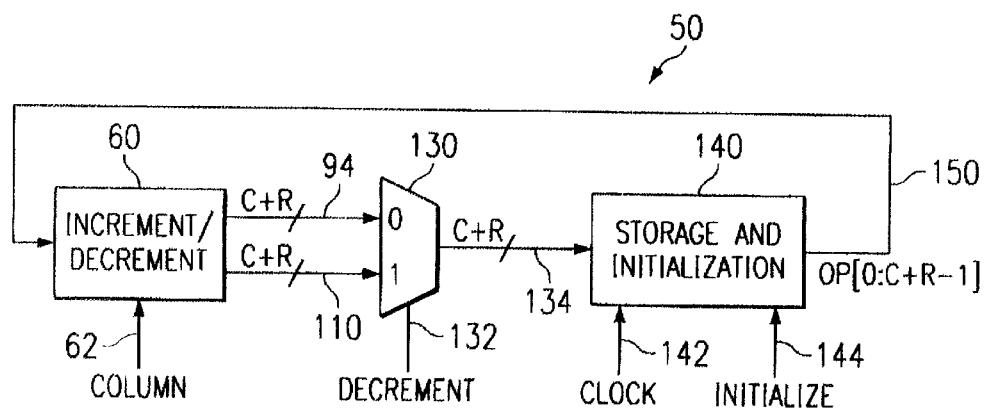
FIG. 9 is a block diagram of a memory address generator, according to a second embodiment of the present invention.

Referring now to FIG. 9, an overall system block diagram of the memory address generator 50 capable of performing either row-major addressing or column-major addressing according to the second preferred embodiment of the present invention, is illustrated. Memory address generator 50 is comprised of increment/decrement block 60, multiplexer 130, and storage and initialization block 140. It is noted here that the select function provided by multiplexer 130 could be shown as part of increment/decrement block 60. Increment/decrement block 60 is provided with column signal 62 that indicates whether to increment/decrement by column or by row and current address bus 150, a feedback signal denoted by operand op[0:C+R−1] that is generated by storage and initialization block 140 and represents the current address being written to in the testing of the memory array. Current address 150 is also provided to the memory array(s) being tested.

Increment/decrement block 60 generates two address bus signals: increment-generated address bus 94 produced by increment circuitry of block 60 and decrement-generated address bus 110 generated by decrement circuitry of block 60. Multiplexer 130 receives the signals of busses 94 and 110, and chooses one of these busses as a function of decrement signal 132 to pass as generated address signal 134 to storage and initialization block 140. When decrement signal 132 is a high logic state ("1") the decrement-generated address 110 produced by the decrement circuitry is selected by multiplexer 130 and passed through as generated address bus 134, but when decrement signal 132 is a low logic state ("0") the increment-generated address 94 produced by the increment circuitry is selected by multiplexer 130 and passed through as generated address bus 134. Storage and initialization block 140 receives generated address bus 134, clock signal 142, initialize control signal 144 and produces current address bus 150 that is fed back to increment/decrement block 60. Storage and initialization block 140 operates to store the signals of current address bus 150 so that it is not affected by generated address bus 134 as it changes. Each of the busses 94, 110, 134, and 150 are C+R bits wide, the width of the addresses of the memory array.

FIG. 10 illustrates the increment/decrement block 60 of FIG. 9. Increment/decrement block 60 has both an increment path and a decrement path; incrementers 74 and 90 together make up the increment circuitry of increment/decrement block 60 while decrementers 98 and 107 comprise the decrement circuitry. Both the increment and decrement paths of FIG. 9 receive column signal 62 and the current address as input signals. Bus 72 is derived from current address bus 150 and is R bits wide, where R is the number of row bits of the address; bus 72 is provided to both row incrementer 74 and row decrementer 98. Bus 88 is also derived from current address bus 150 and is C bits wide, where C is the number of column bits of current address bus 150; bus 88 is provided to both column incrementer 90 and column decrementer 107. The increment path generates increment-generated address bus 94 and the decrement path generates decrement-generated signal address bus 110; both of these busses are presented to multiplexer 130, as shown, which selects either address 94 or 110 as dictated by decrement control signal 132.

In the increment path, row incrementer 74 additionally receives row carry-in row_cin(1) signal 70 from NAND gate 68 and generates row carry-out row_ncout(1) signal 78, a low-true signal, and the row bits 76 of increment-generated address 94. NAND gate 84 receives ncol_count signal 82, signal 62 inverted by inverter 80, and row carry-out row_ncout(1) signal 78 and generates column carry-in col_cin(1)

signal 86 that is provided to column incrementer 90. Column incrementer 90 generates column carry-out col_ncout(l) signal 64, a low-true signal, and the column bits 92 of increment-generated address 94.

In the decrement path, row decrementer 98, in addition to the row bits 72 of the current address, receives row carry-in row_cin(D) signal 96 from NAND gate 95 to generate row carry-out signal row_ncout(D) 102, a low-true signal, and the row bits 100 of decrement-generated address 110. NAND gate 104 is provided with ncol_count signal 82 as well as row carry-out signal row-ncout(D) 102 and in turn generates column carry-in signal col_cin(D) 106. Column decrementer 107 receives this signal 106 and column bits 88 of the current address 150 and generates column carry-out signal col_ncout(D) 66, a low-true signal, and the column bits 108 of decrement-generated address 110.

The increment/decrement paths of FIG. 10 are capable of incrementing/decrementing in either a column-major or a row-major way. By appropriate manipulation of column signal 62, a high-true signal, a column mode or a row mode is specified. When column signal 62 is high ("1") the column mode is selected, causing column incrementer 90 to count up by columns and column decrementer 107 to count down by columns as reflected in increment-generated address 94 and decrement-generated address 110, respectively. Conversely, when column signal 62 is low ("0") the row mode is selected, and row incrementer 74 counts up by rows and row decrementer 98 counts down by rows to produce increment-generated address 94 and decrement-generated address 110, respectively. As previously discussed, decrement signal 132 determines which of increment-generated address 94 or decrement-generated address 110 is passed through multiplexer 130 as generated address 134.

In the case of column signal 62 being high, representative of the column mode, gate 68 is enabled. Gate 68 passes col_ncout(l) signal 64, the column carry-out signal of the increment path that is generated by column incrementer 90, to row incrementer 74. Gate 84 receives row carry-out signal 78 and ncol_count signal 82. In the column mode, gate 84 is disabled and its output, column carry-in signal col_cin(l) 86, is always high, indicative of a column carry-in condition. Column carry-in signal 86 being high causes column incrementer 90 to increment the column bits 92 of increment-generated address 94. The column bits continue to be incremented in this column-major addressing approach and eventually there is a carry-out of the most significant column bit, as reflected in column carry-out signal 64. This causes row incrementer 74 to increment row bits 76.

Incrementing in row-major mode is similar to the column mode and occurs when column signal 62 is low. Gate 68 is disabled so that its output signal, row carry-in signal 70, is always high, causing row incrementer 74 to increment. Signal 82 is high, thereby enabling NAND gate 84 to pass through signal 78 as column carry-in signal 86. Whether column incrementer 90 increments depends upon the state of column carry-in signal 86. When column signal 62 is low, the increment path operates to increment the row bits 76 and eventually a carry-out is generated from the most significant row bit, as reflected in row carry-out signal 78, and then the column bits 92 are incremented by column incrementer 90.

The decrement path comprised of row decrementer 98 and column decrementer 107 operates in similar fashion to decrement the current address as reflected in decrement-generated address 110.

The operation of FIGS. 9 and 10 illustrates that the second embodiment of the present invention is capable of incrementing and decrementing row-major and column-major addresses to generate memory addresses in a flexible and highly controllable fashion. Incrementing/decrementing row-major addressing and column-major addressing in the manner described above provides a very flexible and efficient vehicle for generating adjacent memory array addresses in any of four directions: S to N (incrementing by row-major addressing), W to E (incrementing by column-major addressing), N to S (decrementing by row-major addressing), and E to W (decrementing by column-major addressing).

Figure 11:
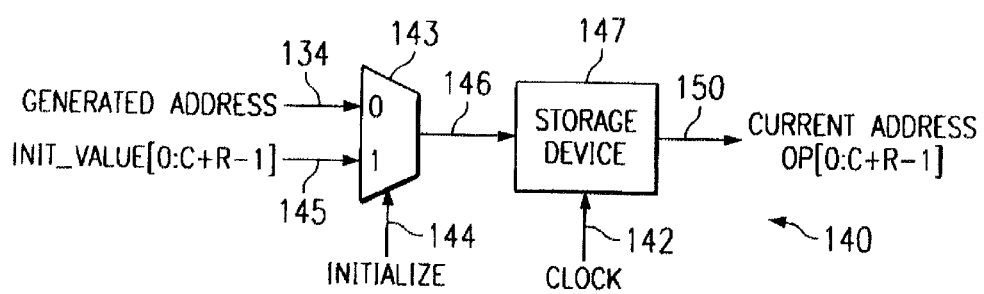
FIG. 11 illustrates the storage and initialization block of FIG. 5, according to the present invention.

Referring now to FIG. 11, storage and initialization block 140 is demonstrated. Storage and initialization block 140 is shown as having a multiplexer 143 and a storage device 147. Generated address bus 134 from multiplexer 130, start address init_value[0:C+R–1] signal 145, and initialize signal 144 are provided to multiplexer 144, and clock signal 142 is provided to storage device 147, as shown. Initializing multiplexer 143 selects either address 134 or 145, as determined by initialize signal 144, and provides the selected input to storage device 147 as bus 146.

Figure 12:
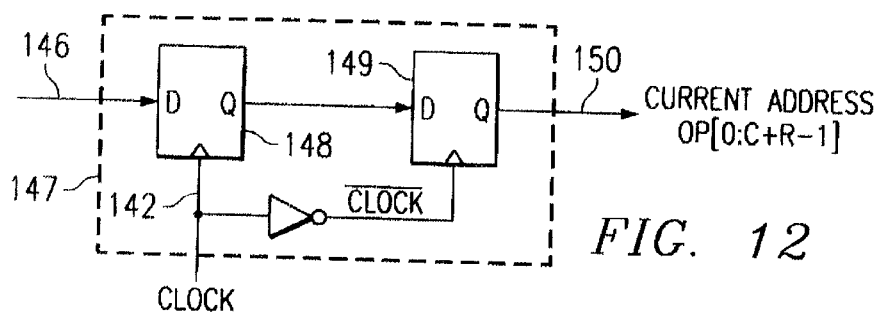
FIG. 12 illustrates example storage device circuitry, according to the present invention.

Storage and initialization block 140 serves two purposes. First, it operates to ensure that the bits of current address bus 150 are not corrupted by the incrementation/decrementation of generated address bus 134. To achieve this storage device 147 is provided with clock signal 142. Clock signal 142 may be the clock of the memory array device-under-test (DUT) or it may be a derivative clock signal. If clock 142 is a derivative signal of the clock of the DUT memory array, then it is possible to selectively stop operation of memory address generator 150 without affecting the operation of the memory array itself. At any rate, clock signal 142 clocks address bus 146 into storage device 147 where it is temporarily stored until the next clock cycle. This temporary storage of address bus 146 protects current address bus 150 from being changed by changes on bus 146, as can be seen in FIG. 12. FIG. 12 illustrates a sample implementation of storage device 147 in which two latches 148, 149 are used to provide this storage functionality; registers may also be used.

Second, storage and initialization element 140 serves an initialization function. Referring back to FIG. 11, it can be seen that multiplexer 143 is controlled by initialize control signal 144 to select either generated address 134 or start address 145. The selected address is then provided to storage device 147 for temporary storage. Generally speaking, initialize signal 144 causes multiplexer 143 to choose generated address 134 so that increment/decrement block 60 continues to generate adjacent addresses in the manner described above. Sometimes, however, the current address 150 provided to increment/decrement block 60 must be initialized and assertion of high-true initialize signal 144 will cause start address 145 to be provided to storage device 147 and, ultimately, to increment/decrement block 50 as address 150. Upon power-up of memory address generator 50, for instance, current address 150 must be initialized with a starting address at which column-major or row-major addressing is to begin.

Start address 145 may be either a fixed value or a programmable value. Hardwiring start address 145 is an example of a fixed value; whenever initialize signal 144 is asserted high, due to a start-up condition or otherwise, start address 145 will always be the hardwired address and operation of memory address generator 50 will thus always commence at that fixed address.

A more powerful and interesting approach, however, is when start address 145 is a programmable value. Start address 145 may be provided by a register capable of being programmed. Subsequent to programming the register with the desired start address, the current address 150 is changed to that address by simply asserting initialize signal 144 so that start address 145 is selected by multiplexer 143. A major benefit of programmably changing start address 145 in this manner is that non-adjacent areas of the memory array may be readily tested by simply programming in the next desired testing location and asserting initialize signal 144 to select that new address location. This approach is a far superior approach to testing in that it provides the flexibility to selectively test target areas of the array and, in so doing, save testing time.

Figures 13, 15:
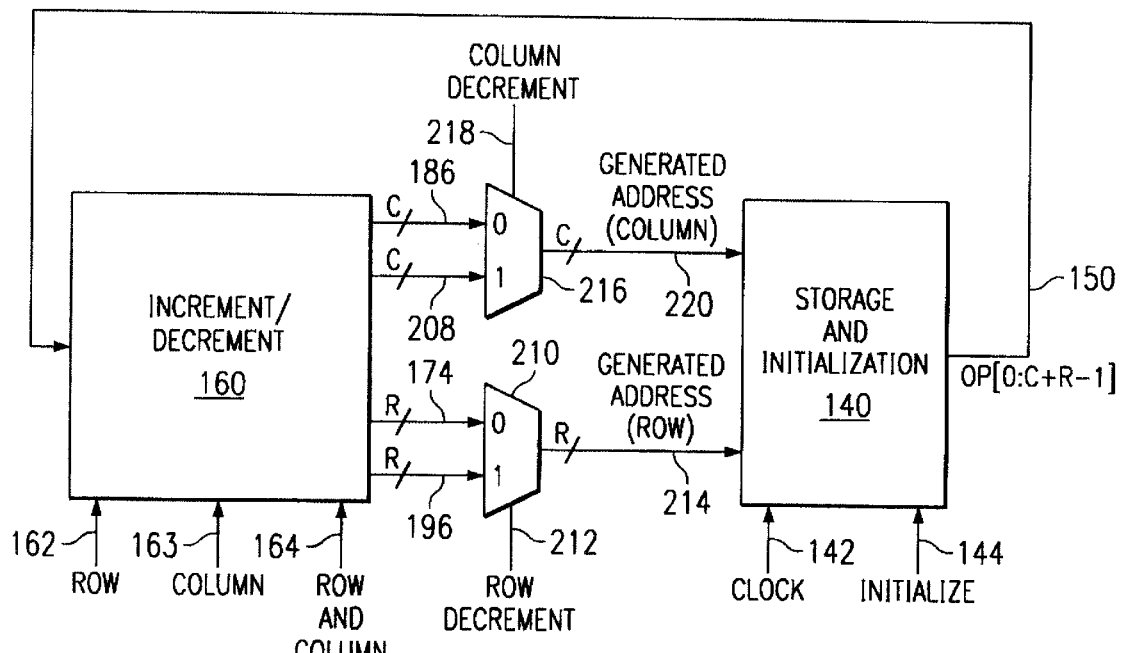
FIG. 13 illustrates a block diagram of a memory address generator, according to a third embodiment of the present invention.
FIG. 15 provides an example of the diagonal row-and-column addressing of the present invention.

Referring now to FIGS. 13–15, the third embodiment of the present invention, capable of performing column-major addressing, row-major addressing, and diagonal addressing, is illustrated. In the memory address generator of FIG. 13, an increment/decrement block 160, multiplexers 210 and 216, and storage and initialization block 140 are shown. The selecting function performed by multiplexers 210, 216 may be placed within increment/decrement block 160 if so desired. Increment/decrement block 160 is provided with row (and not column) signal 162, column (and not row) signal 163, row and column signal 164, and current address signal 150 generated by storage and initialization block 140. It uses these input signals to generate increment-generated column address 186, decrement-generated column address 208, increment-generated row address 174, and decrement-generated row address 196 as shown. Multiplexer 210 chooses one of the row addresses 174, 196 as controlled by row decrement/increment signal 212 and produces generated row address 214; multiplexer 216 chooses one of the column addresses 186, 208 as controlled by column decrement/increment signal 218 to produce generated column address 220. Multiplexers 210 and 216 allow for independent selection of increment/decrement between the row and column busses. Storage and initialization block 140 receives signals 214, 220 and is controlled by clock signal 142 and initialize control signal 144 to generate current address 150.

FIG. 14 illustrates increment/decrement block 160 of the memory address generator shown in FIG. 13, according to the third preferred embodiment of the invention. Increment/decrement block 160 has both an increment path and a decrement path; incrementers 172, 184 and multiplexers 168, 180 together make up the increment circuitry of increment/decrement block 160 while decrementers 194, 206 and multiplexers 192, 202 comprise the decrement circuitry. As previously noted, the select functionality provided by multiplexers 210 and 216 could be brought inside increment/decrement block 160. Both the increment and decrement paths of FIG. 14 receive row (and not column) signal 162, column (and not row) signal 163, both column and row signal 164, and the current address (shown as bus 150 of FIG. 8), comprised of row bits 72 and column bits 88, as input signals. Row bus 72 is R bits wide, where R is the number of row bits of the current address 150 and is provided to both row incrementer 172 and row decrementer 194 as shown. Column bus 88 is C bits wide, where C is the number of column bits of current address 150, and is provided to both column incrementer 184 and column decrementer 206. The increment path generates increment-generated row address 174 and increment-generated column address 186; the decrement path generates decrement-generated row address 196 and decrement-generated column address 208. The increment- and decrement-generated row addresses 174 and 196, respectively, are presented to multiplexer 210 where one is chosen and passed through as generated row address 214 based upon the logic state of row decrement signal 212 (decrement-generated row bits 196 are chosen when row decrement signal 212 is a high logic state). Similarly, the increment- and decrement-generated column addresses 186 and 208, respectively, are provided to multiplexer 216 which chooses one to pass through as generated column address 220 based upon the logic state of column decrement signal 218.

In the increment path, multiplexer 168 has a first input "0" tied to a high logic state, such as Vdd, a second input "1" that receives the column carry-out signal 188, col_coutl, generated by column increment block 184, and a third input "2" that receives the signal 167 generated by column-increment carry-out function block 166. The control signals 162, 163, and 164 determine which input signal that multiplexer 168 will select and pass on as signal 170. If the column signal 163 is asserted, meaning that the column bits are to be incremented/decremented but the row bits are not to be incremented/decremented, that column carry-out signal 188 will be selected and passed. If row signal 162 is asserted, meaning that the row bits are to be incremented/decremented but the column bits are not to be incremented/decremented, than multiplexer 168 will pass a logic high "1" as signal 170. Signal 167 is passed if column&row signal 164 is asserted, meaning that both the row and column bits are to be incremented/decremented.

Row incrementer 172 receives the selected signal 170 and row bits 72 of current address 150 and generates row bits 174 and row carry-out signal 176 as shown. If signal 170 is asserted then row incrementer 172 is caused to increment. The state of row carry-out signal 176 is determined by whether a row increment has caused a carry-out.

Multiplexer 180 receives row carry-out signal 176 at input "0", a high logic state signal at input "1," and signal 179 which is produced by passing row carry-out signal 176 through row-increment carry-out function block 178. If signal 182 is asserted, then column incrementer 184 is caused to increment. The logic state of column carry-out signal 188 depends upon whether the incrementation of column bits 88, if it occurs, has caused a carry-out condition. Column carry-out signal 188 is the feedback signal of the increment path that is provided to the "1" input of multiplexer 168 as shown.

The decrement path is comprised of row decrementer 194, column decrementer 206, column-decrement carry-out function block 190, row-decrement carry-out function block 200, multiplexers 192, 202 and receives the current address 72, 88 and control signals 162, 163, 164 as input signals. It operates in similar fashion to the increment path to decrement the row bits, the column bits, and/or both the row and column bits of the current address when controlled to do so by signals 162, 163, 164.

The carry-out function blocks 166, 178, 190, and 200 contain combinational logic capable of implementing a defined function in response to the "rollover" case where both incrementers/decrementers produce a carry-out signal. For instance, in the increment path carry-out function blocks 166, 178 implement their combinational logic as a function of row carry-out signal 176 (not shown) and column carry-out signal 188.

The function of the carry-out function blocks is determined by the combinational logic contained therein and may be any desired function, as discussed previously in conjunction with FIGS. 6 and 8. In the simplest case, one or more function blocks may cause the row and column bits to be incremented/decremented completely independently. Or, the combinational logic of the carry-out function blocks could provide for the rows and the columns to be incremented/ decremented simultaneously so as to produce diagonal movement from the current address to the generated address.

The diagonal address generation of the first and third embodiment is illustrated in FIG. 15. A memory array having eight rows and four columns is shown. The numbered cells indicate the progression of the address generation. Increment/decrement block 160 generated 12 addresses, starting with the address of cell 1 and ending with the address of cell 12. It can be seen that this progression represents diagonal movement. To move to cell 2 from cell 1 requires a SE movement, as does the subsequent movement to cells 3 and 4. The generation of the address for cell 5 required a SW movement from cell 4 to 5. Movement to cells 6, 7, and 8 occurs in a SE direction. Cells 10, 11, 12 are in a SE direction.

The generation of the addresses corresponding to cells 2, 3, and 4 required that increment/decrement block 160 increment both the row lsb and the column lsb. Similarly, the movement to cell 5 from cell 4 also occurred by incrementing both the row and column, as is the case in the movement to cells 6, 7, and 8.

The generation of the address for cell 9 is an interesting case. It occurred in one of two ways. Either the row bits of the address of cell 8 were incremented two times, or one time in the case of a double incrementer, and the column bits were incremented just once, or initialize signal 144 was asserted to cause start address init_value[0:C+R−1] signal 145, set to the address of cell 9, to become the current address 150.

The diagonal address generation demonstrated in FIGS. 4–6 and FIGS. 13–15 provides even more flexibility than does the embodiment of FIGS. 9 and 10 in generating the addresses of adjacent memory cells. The increment/decrement block is capable of generating adjacent memory array address in one of four directions: S to N, N to S, E to W, W to E, NE, NW, SE, and SW.

Figure 16:
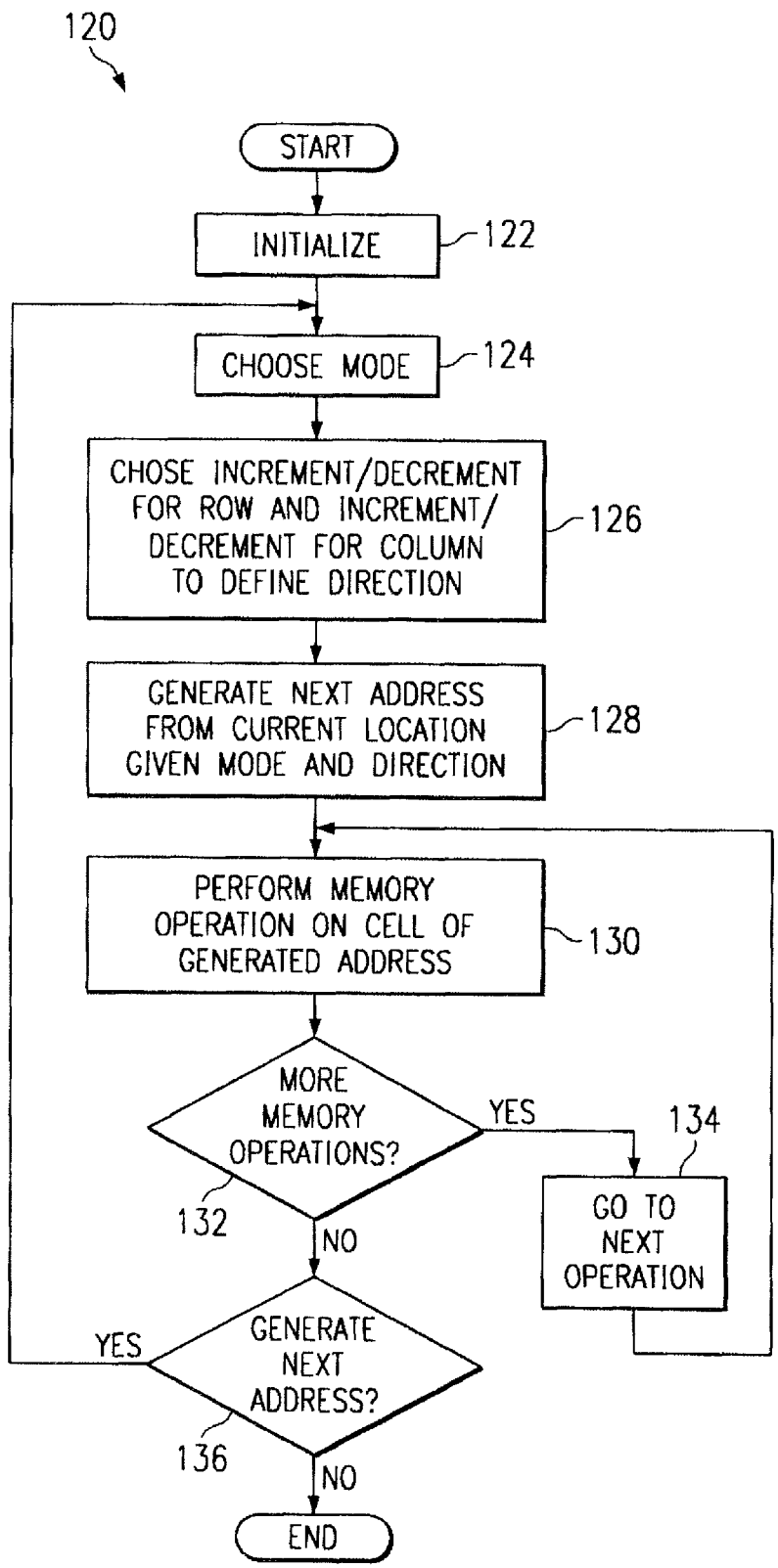
FIG. 16 is a flowchart of the methodology of the present invention.

Referring now to FIG. 16, flowchart 120 demonstrates the methodology of the present invention. In describing flow 120 reference will be made to the structure of FIGS. 5 to 15; one skilled in the art, however, will recognize that various changes in form and detail may be made to the structure herein without departing from the spirit and scope of the methodology of the present invention.

First, at Block 122 the current address is initialized. The current address from which the next address is generated must at least be initialized at least one time when the memory address generator is first powered-up. As discussed previously, the initial current address 145 may be predetermined or programmed to be a desired value. And, as previously discussed initialization of the current address may occur at any time in the flow of FIG. 16 such as, for instance, when a non-adjacent memory address is sought to be generated.

After a valid current address 150 is defined, an increment/decrement mode must be chosen at Block 124. The mode may be to count by columns, by rows, or by both rows and columns. The second embodiment of the invention is capable of counting by rows or by columns but not by both rows and columns, as described above. The first and third embodiments of the invention is capable of counting by rows, by columns, and by both rows and columns. Thus, the mode selected will determine whether diagonal addressing will be used.

Next, the direction in which the generated address 134 moves relative to the current address 150 is defined at Block 126. Once the mode is defined in Block 124, the direction is defined by whether an increment-generated address or a decrement-generated address is chosen. A separate direction is chosen for both rows and for columns as shown in Block 126. Again, the invention allows movement in one of eight directions when generating the next address 134: north, south, east, west, northeast, northwest, southeast, and southwest.

The choice of direction will determine which of the two embodiments of the present invention may be employed to generate address 134. If a diagonal direction, northeast, northwest, southeast, or southwest, is chosen, then the memory address generator of the first or third embodiment of FIG. 14 must be used; if, however, a north, south, east, or west direction is designated, then any of the embodiments of the invention may be used. It is noted that the choices of Blocks 124 and 126 could be made at the same time and therefore combined into one block of flow 120.

After the desired mode and increment/decremented-generated address are chosen to define direction, Block 128 generates the next address 134 as described above. With the next address generated, memory operations associated with testing the memory array are performed at Block 130; Blocks 132 and 134 ensure that the required number of memory operations on the memory cell defined by the address generated at Block 128 are performed. A typical operation might consist of writing a 0 or a 1 to the memory cell defined by the generated address 134; that memory cell could then be read to see if it contains the expected value.

When no more memory operations are to be performed on the cell of the generated address, Decision Block 132 directs the flow to Decision Block 134 which determines if another memory cell address is to be generated. If so, the flow returns to Block 124 to loop through Blocks 124–136 again. Decision Block 136 will return the flow to Block 124 until no more memory addresses are to be generated.

While the invention has been particularly shown and described with reference to a preferred embodiment, it will be understood by those skilled in the art that various changes in form and detail may be made therein without departing from the spirit and scope of the invention.

What is claimed is:

1. A method for generating memory addresses, comprising:
   a) defining a current memory address;
   b) choosing a plurality of modes and an increment-generated address, a decrement-generated address, or a combination increment and decrement address to define a direction of a plurality of directions of a next memory address to be generated;
   c) generating the next memory address according to the mode and direction defined, wherein generating a row address of the next memory address and generating a column address of the next memory address are interdependent operations characterized in that a row carry-out signal will affect generation of the column address and a column carry-out signal will affect generation of the row address; and
   repeating steps a)–c) if another memory address is to be generated.

2. The method of claim 1, further comprising:
   initializing the current memory address, wherein initializing the current memory address can occur at any time in the method.

3. The method of claim 1, wherein after generating the next memory address, further comprising:
   performing one or more memory operations on a cell defined by the next memory address.

4. A method for generating memory addresses, comprising:
   a) defining a current memory address;
   b) choosing a count mode by which an increment-generated address, a decrement-generated address, or a combination increment and decrement address are to be generated;
   c) generating the increment-generated address, the decrement-generated address, or the combination increment and decrement address, wherein generating a row address and generating a column address of the increment-generated address, the decrement-generated address, or the combination increment and decrement address are interdependent operations characterized in that a row carry-out signal will affect generation of the column address and a column carry-out signal will affect generation of the row address;
   d) using the increment-generated address or the decrement-generated address to define a next generated address that has a direction defined by the mode and the increment-generated address or the decrement-generated address selected; and
   repeating steps a–d if another memory address is to be generated.

5. The method of claim 4, further comprising:
   initializing the current memory address, wherein initializing the current memory address can occur at any time.

6. The method of claim 4, wherein after defining the next memory address, further comprising:
   performing one or more memory operations on a cell having the next memory address.

7. A memory address generation system, comprising:
   an increment/decrement circuit that receives one or more row control signals, one or more column control signals, an increment/decrement control signal, and a current address and generates a generated address, wherein the increment/decrement circuit generates a row address and generates a column address of the generated address in interdependent operations characterized in that a row carry-out signal will affect generation of the column address and a column carry-out signal will affect generation of the row address; and
   a storage and initialization circuit that receives the generated address from the increment/decrement circuit, a clock signal, and an initialization control signal, and generates the current address, wherein the storage and initialization circuit temporarily stores the generated address so that the current address is not affected by the generated address from the increment/decrement circuit and wherein the storage and initialization circuit initializes the current address.

8. The system of claim 7, wherein the increment/decrement circuit comprises:
   a row function element, characterized as having a selectively defined row mode, that receives a column carry-out signal and the one or more row control signals and generates a row carry-in signal and a row increment/decrement control signal in accordance with the row mode;
   a row increment/decrement element that receives a row address of the current address, the row carry-in signal, and the row increment/decrement control signal and generates a row carry-out signal and a row address of the generated address in accordance with the row carry-in signal and the row increment/decrement control signal;
   a column function element, characterized as having a selectively defined column mode, that receives the row carry-out signal and the one or more column control signals and generates a column carry-in signal and a column increment/decrement control signal in accordance with the column mode; and
   a column increment/decrement element that receives the column address of the current address, the column carry-in signal, and the column increment/decrement control signal and generates the column carry-out signal and a column address of the generated address in accordance with the column carry-in signal and the column increment/decrement control signal.

9. The system of claim 7, wherein the storage and initialization circuit comprises:
   a select element that receives the generated address from the increment/decrement circuit, a start value of the current address, and the initialize control signal, and is controlled by the initialize control signal to select the generated address or the start value of the current address to be a selected address produced by the select element; and
   a storage element that receives the selected address produced by the select element and the clock signal and temporarily stores the selected address according to the clock signal while generating the current address,
   wherein the select element selects the start value when the initialization control signal is a first logic state and selects the generated address when the initialization control signal is a second logic state.

10. A decrement/increment circuit for generating memory addresses, comprising:
   an increment path that generates an increment-generated address given a control signal and a current address, wherein the increment-generated address has a plurality of column bits and a plurality of row bits generated by interdependent operations of the increment Path characterized in that a first row carry-out signal received by the increment path will affect generation of the plurality of column bits of the increment-generated address and a first column carry-out signal received by the increment Path will affect generation of the plurality of row bits of the increment-generated address; and
   a decrement path that generates a decrement-generated address given the control signal and the current address, wherein the decrement-generated address has a plurality of column bits and a plurality of row bits generated by interdependent operations of the decrement path characterized in that a second row carry-out signal received by the decrement path will affect generation of the plurality of column bits of the decrement-generated address and a second column carry-out signal received by the decrement path will affect generation of the plurality of row bits of the decrement-generated address.

11. The circuit of claim 10, wherein when the control signal is a first logic state, the increment path and the decrement path count by columns and when the control signal is a second logic state, the increment path and the decrement path count by rows.

12. The circuit of claim 10, wherein when the control signal is a first logic state the increment path increments the column bits of the current address and the decrement path decrements the column bits of the current address to generate the plurality of column bits of the increment-generated address and the plurality of column bits of the decrement-generated address, and when the control signal is a second logic state the increment path increments the row bits of the current address and the decrement path decrements the row bits of the current address to generate the plurality of row bits of the increment-generated address and the plurality of row bits of the decrement-generated address.

13. The circuit of claim 10, wherein the increment-path comprises:

- a first logic element that receives the control signal and a first column carry-out signal and generates a first row carry-in signal;
- a row incrementer that receives a plurality of row bits of the current address and the first row carry-in signal and generates the row bits of the increment-generated address and a first row carry-out signal;
- a second logic element that receives the first row carry-out signal and a signal that is the inverse of the control signal and generates a first column carry-in signal; and
- a column incrementer that receives the first column carry-in signal and a plurality of column bits of the current address and generates the column bits of the increment-generated address and the first column carry-out signal;

and wherein the decrement-path comprises:

- a third logic element that receives the control signal and a second column carry-out signal and generates a second row carry-in signal;
- a row decrementer that receives the plurality of row bits of the current address and the second row carry-in signal and generates the row bits of the decrement-generated address and a second row carry-out signal;
- a fourth logic element that receives the second row carry-out signal and the signal that is the inverse of the control signal and generates a second column carry-in signal; and
- a column decrementer that receives the second column carry-in signal and the plurality of column bits of the current address and generates the column bits of the decrement-generated address and the second column carry-out signal.

* * * * *